United States Patent [19]

Eichen et al.

[11] Patent Number: 4,568,614
[45] Date of Patent: Feb. 4, 1986

[54] STEEL ARTICLE HAVING A DISORDERED SILICON OXIDE COATING THEREON AND METHOD OF PREPARING THE COATING

[75] Inventors: Erwin Eichen, West Bloomfield; John Keem, Bloomfield Hills, both of Mich.

[73] Assignee: Energy Conversion Devices, Inc., Troy, Mich.

[21] Appl. No.: 625,058

[22] Filed: Jun. 27, 1984

[51] Int. Cl.$^4$ .............................................. B05D 3/06
[52] U.S. Cl. ..................................... 428/450; 427/39; 427/93; 427/94; 427/95
[58] Field of Search ........................ 427/38, 39, 93, 94, 427/95; 428/446, 450, 627, 641

[56] References Cited

U.S. PATENT DOCUMENTS

| | | | |
|---|---|---|---|
| 3,424,661 | 1/1969 | Androshuk et al. | 427/39 |
| 3,485,666 | 12/1969 | Sterling et al. | 427/39 |
| 3,655,438 | 4/1972 | Sterling et al. | 427/39 |
| 4,346,123 | 8/1982 | Kaufmann | 427/38 |
| 4,393,097 | 7/1983 | Hirai et al. | 427/94 |
| 4,450,205 | 5/1984 | Itaba et al. | 428/627 |

FOREIGN PATENT DOCUMENTS 134719 10/1979 Japan ................................. 428/627

Primary Examiner—John H. Newsome
Attorney, Agent, or Firm—Lawrence G. Norris; Richard M. Goldman; Judith M. Riley

[57] ABSTRACT

Disclosed is a coated steel article, e.g., a stainless steel article, having a corrosion resistant coating of disordered silicon carboxynitride over at least a portion of the steel surface. Also disclosed is a method of forming an adherent, ductile, disordered silicon carboxynitride coating on a steel substrate by glow discharge deposition.

51 Claims, 1 Drawing Figure

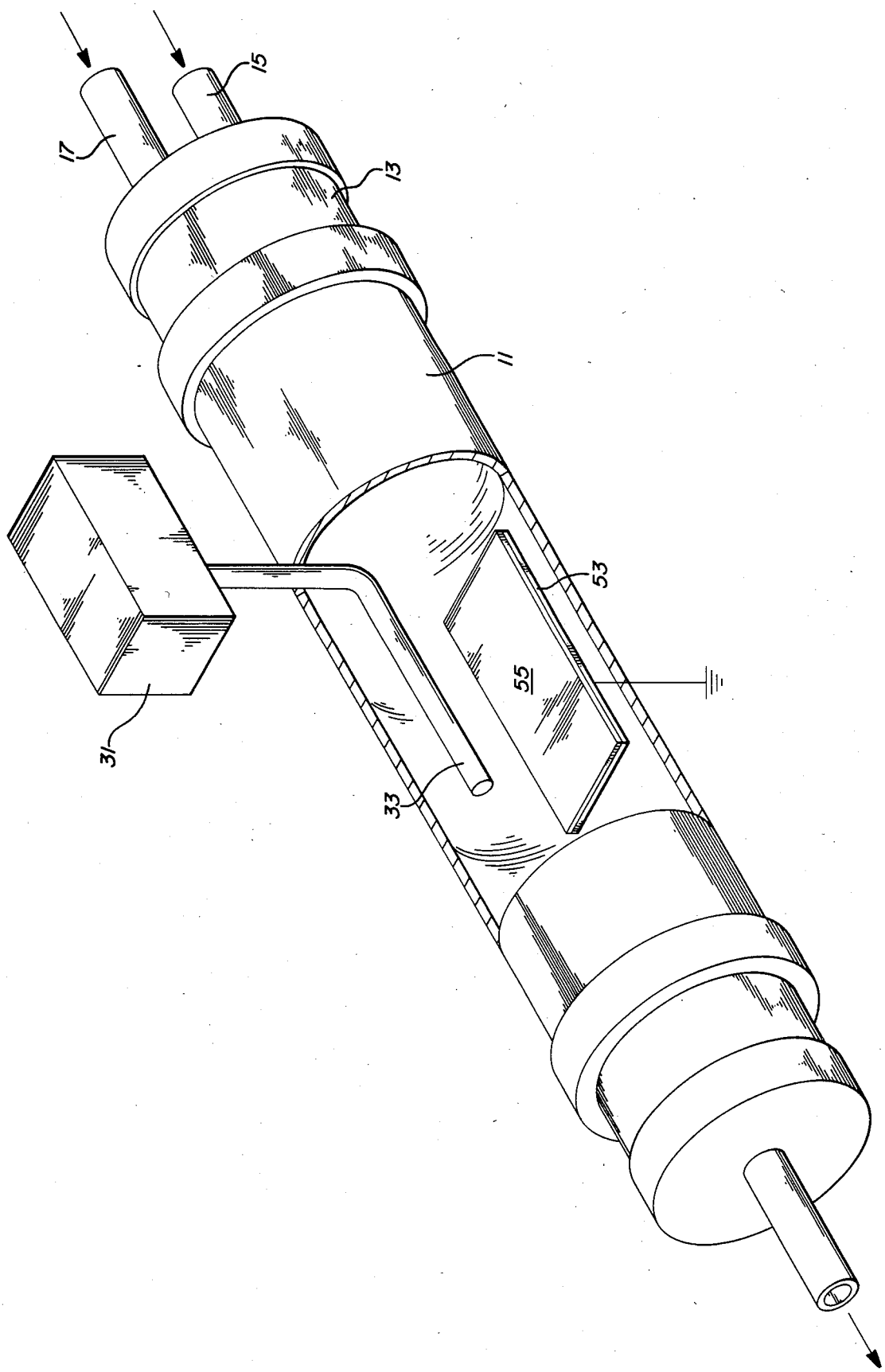

STEEL ARTICLE HAVING A DISORDERED SILICON OXIDE COATING THEREON AND METHOD OF PREPARING THE COATING

BACKGROUND OF THE INVENTION

Metallic corrosion is a loss of material that occurs when metals are exposed to hostile environments. The chemical products of corrosion are oxidized products, where, by oxidized products are meant products containing the metal in a non-zero valence state.

The "return" of metals from a useful metallic state to an oxidized state imposes a massive cost on industrial economies. The annual economic burden of corrosion has been estimated to be on the order of 1 percent of the gross national products of the industrialized countries.

From thermodynamic considerations, the corrosion reaction (1), $$M + M'^+ = M^+ + M' \quad (1)$$

where M is the metal, and $M'^+$ is another cation, can occur spontaneously if the equilbrium electrode potential for reaction (2), $$M'^+ + 1e^- = M' \quad (2)$$

is greater than the equilibrium electrode potential for reaction (3), $$M^+ + 1e^- = M. \quad (3)$$

This is because the oxidation reaction may be driven by coupling it to the reduction of the cation. Thus, the oxidation of iron, reaction (4), $$\tfrac{1}{2}Fe = \tfrac{1}{2}Fe^{++} + {}^.E^-, \quad (4)$$

which has an equilibrium electrode potential for the reaction 4(a), $$\tfrac{1}{2}Fe^{++B} + 1e^- = \tfrac{1}{2}Fe \quad 4(a)$$

of −0.44402 V, can be driven by coupling it to a reaction having a higher equilibrium electrode potential. In the case of the oxidation of iron, reaction (4), the driving reactions include:

$$H^+ + e^- = \tfrac{1}{2}H_2, \quad (5)$$

$$H^+ + \tfrac{1}{4}O_2 + e^- = \tfrac{1}{2}H_2), \quad (6) \text{ and}$$

$$\tfrac{1}{2}H_2O + \tfrac{1}{4}O_2 + e^- = OH^- \quad (7)$$

where reactions (5) and (6) are in acidic media, and reaction (7) is an alkaline media.

Various factors increase the rate of corrosion. These include the nature of the oxidizing reactants present, that is, the reactivity, concentration and temperature of the oxidizing environment; and the nature of the material, i.e. working history, thermal history, granularity, grain size, and grain orientation, among others. Additionally, kinetic factors such as bulk diffusion and electron transfer reactions determine the rate and progress of corrosion.

Corrosion may be in the form of uniform attack, characterized by progressive and uniform thinning of the metal and either the growth of an oxide or the loss of material. Alternatively, the corrosion may be a nonuniform corrosion, exemplified by galvanic corrosion arising from the juxtaposition of two or more metals. Galvanic attack is evidenced by dissolution of the more reactive metal.

Another form of a nonuniform corrosion is crevice corrosion which results in corrosion at flanges, the meeting of cross members, breaks in surface coatings, at a meniscus, and at water lines.

Various effects are observed in nonuniform corrosion. One effect is selective grain boundary attack which can cause whole crystallographic grains of the metal to fall out resulting in layer corrosion. Another effect of nonuniform corrosion is the preferential dissolution of one component in an alloy. Still another effect of non-uniform corrosion is the selective dissolution of a crystallographic grain along one crystallographic orientation. Other effects of nonuniform corrosion result from variations in reactivity brought about by surface films, surface oxides, nitriding and the like, such as pitting attack.

Additionally, mechanical stress may increase corrosion. For example mechanical stress results in stress corrosion cracking, which is a form of crevice attack at cracks that develop and constitute a self-perpetuating region of localized attack. Erosion corrosion, also known as impingement corrosion, occurs as the result of impingement of entrained particles in a stream of corrosive material. Mechanical effects of corrosion are evidenced by hydrogen embrittlement and corrosion fatique.

Various means have been attempted to limit corrosion. These include sacrificial anodes, impressed current cathodic protection, galvanization, formation of stable oxides, and protective coatings. Coating the surface, as with a paint, polymer, or metalloid, provides an impermeable layer which eliminates contact between the corrosive medium and the metal. However, in order to be effective, coatings must be adherent and pin-hole free. This is because defects allow a corrosive medium, e.g., water, chloride ion, sulfate ion, sulfur compounds, or oxygen, access to the metal. The corrosive medium can then supply electrons at the edges of the pin-hole. The resulting corrosion takes place under the coating, where the extent of damage is difficult to assess. Moreover, lack of adhesion can cause the coating to delaminate or develop holes or voids. One class of protective coatings found to be particularly desirable are coatings of disordered materials, for example coatings of iron with various oxide forming metals, and coatings of iron with various nonmetals deposited or formed under conditions that result in a disordered material. Corrosion can also be reduced by suitable alloying agents, as is the case with stainless steels.

Stainless steels are desired for their normally high corrosion resistance and attractive appearance. However, one problem encountered with stainless steels, especially when used for exterior applications, is atmospheric corrosion. Atmospheric corrosion is especially severe in marine atmospheres, where chloride ion is present in atomospheric water vapor, and in industrially polluted atmospheres, where various sulfur compounds are present in the atmosphere. Coatings that are capable of reducing the effects of atmospheric corrosion do so at the expense of the appearance of the stainless steel.

SUMMARY OF THE INVENTION

As herein contemplated, a coating of disordered silicon carboxynitride is applied by plasma deposition processes over at least a portion of a steel substrate, e.g., a stainless steel substrate. The resultant coated steel article is characterized by an adherent, pin hole free, bendable, ductile, weldable, workable coating. The coating is corrosion resistant, especially to chloride ions and sulfur containing products of combustion. Moreover, the coating, at the thicknesses herein contemplated, is transparent, preserving the lustre of the underlying steel substrate.

The coatings are prepared by plasma deposition processes, e.g., glow discharge or reactive sputtering, which provide a high quench rate. It is believed that the high quench rates of the contemplated processes provide the desired disordered materials.

The disordered coating compositions contain disordered non-stochiometric silicon carboxynitrides represented by the formula $SiC_xO_yN_z$, where x is less than 1.0, and preferably from 0.5 to 1.0, y is less than 2.0, preferably from 1.0 to 2.0, is less than 1.33, and preferably from 0.6 to 1.33, and (x+0.5y+0.75z) is less than or equal to 1.0. Additionally, the herein contemplated disordered coating compositions may contain boron and/or phosphorus.

By "disordered" compositions are meant compositions characterized by the substantial absence of long range order. The morphology may be amorphous, microcrystalline, polycrystalline, or a combination thereof. Additionally, amorphous, microcrystalline, or polycrystalline regions may have crystalline inclusions without departing from the invention herein contemplated.

"Glow discharge deposition", as used herein, means plasma assisted chemical vapor deposition substantially as described in U.S. Pat. No. 4,226,898 to Stanford R. Ovshinsky, et al for *Amorphous Semiconductors Equivalent To Crystalline Semiconductors Produced By A Glow Discharge Process.* "sputtering", as used herein, means the plasma assisted transport of a material from a source, i.e., a target, to a substrate "Reactive sputtering", as used herein, means the use of both a sputtering target and a glow discharge gas or gases that are reactive with each other under sputtering conditions, whereby to deposit a composition thereof onto the substrate. Reactive sputtering combines sputtering and glow discharge deposition and may be carried out with a radio frequency field or a microwave field. Reactive sputtering may further be magnetron assisted. A "plasma" region is formed during both sputtering and glow discharge deposition.

By "radio frequency radiation", also referred to herein as "r.f. radiation", is meant that portion of the electromagnetic spectrum having frequencies between the audio portion of the electromagnetic spectrum and the far infrared portion of the electromagnetic spectrum, i.e., from 0.1 megahertz to about 100 gigahertz, and wave lengths corresponding thereto of from about $3 \times 10^3$ meters for 0.1 megahertz radiation to $3 \times 10^{-3}$ meter for 100 gigahertz radiation.

By "microwave radiation" is meant that portion of radio frequency radiation having frequencies in the gigahertz range, i.e., above about 1 gigahertz (which is the generally accepted definition found in the *IEEE Standard Dictionary of Electrical and Electronics Terms,* F. Jay, editor, IEEE, New York, NY (1977) at page 416) and wave lengths corresponding thereto of less than about $3 \times 10^{-1}$ meter for 1 gigahertz radiation. The upper range of microwave radiation is less than the frequencies and wavelengths of the "far infrared" portion of the electromagentic spectrum.

Glow discharge deposition, described above, may be carried out with a direct current field, with an alternating, or with a biased alternating current field. When glow discharge deposition is carried out with an alternating current field or a biased alternating current field it is referred to as "radio frequency glow discharge deposition". "Microwave glow discharge deposition" is "radio frequency glow discharge deposition" where the radio frequency component is in the microwave range.

The resulting coatings, when applied by glow discharge deposition or by reactive sputtering, especially at microwave frequencies, form particularly stable, corrosion resistant, coatings on steel.

THE FIGURE

The invention contemplated herein may be understood by reference to the FIGURE appended hereto.

The FIGURE is a partial cutaway, isometric schematic view of glow discharge apparatus useful in an embodiment of the invention where the corrosion resistant coating is applied by microwave glow discharge.

DETAILED DESCRIPTION OF THE INVENTION

The invention is a coated steel article useful, for example, in exterior applications such as architectural shapes, vehicle and aircraft bodies, and cargo containers where a lustrous appearance is desirable. The coated article is also useful in corrosive applications where purity of the product is essential, as in chemical processing equipment and food processing equipment, for example, heat exchangers, reactors, heating kettles, reaction kettles, and the like. The coated articles are especially useful where the luster of the underlying substrate must be preserved.

The underlying article is a steel substrate, for example, a stainless steel substrate. Stainless steel is a lustrous material characterized by relatively high resistance to corrosive environments. However, industrial and marine environments can corrode stainless steel to the extent where it loses its lustre.

The herein contemplated coating is a transparent, corrosion resistant coating comprising disordered silicon carboxynitride. The disorder of the silicon carboxynitride may be such as to be amorphous, microcrystalline, polycrystalline lacking long range compositional order, or a mixture of at least two types of disorder as amorphous, microcrystalline, or polycrystalline. Additionally, the disordered silicon carboxynitride coating material may be characterized by the presence of crystalline inclusions while still being within the intended scope of the invention.

The disordered silicon carboxynitride is a non-stochiometric silicon compound represented by the formula $SiC_xO_yN_2$, where x is less than 1.0, and preferably from 0.5 to 1.0, y is less than 2.0, and preferably from 1.0 to 2.0, z is less than 1.33, and preferably from 0.66 to 1.33, and (x+0.5y+0.75z) is less than or equal to 1.00. Additionally, the coating may contain boron and/or phosphorus, for example, combined with the silicon carboxynitride. While the disordered coating material is referred to as silicon carboxynitride, it may contain regions of silicon carbide, $SiC_x$, silicon oxide, $SiO_y$, silicon nitride, $SiN_z$, silicon oxycarbide, $SiC_xO_y$, silicon oxynitride, $SiO_yN_z$, and silicon carbonitride, $SiC_xN_z$, where x, y, and z are as defined above.

Additionally, the disordered coating may contain up to 10 atomic percent of phosphorous and/or boron. For example, the coating may contain $SiC_x$ with up to 10 atomic percent boron incorporated therein, or $SiO_y$ with up to 10 atomic percent phosphorus incorporated therein, or $SiN_z$ with up to 10 atomic percent phosphorus incorporated therein.

The herein contemplated coating has a thickness of from about 100 angstroms to about 1000 angstroms. Thickness less than about 100 angstroms should be avoided whereby to avoid pin holes. The maximum coating thickness of about 1000 angstroms is such as to provide a substantially transparent coating, preserving the lustrous appearance of the underlying substrate, and not interfering with ductility, or bendability of the article, or causing the surface to delaminate on bending, working, or welding. The coating thickness may exceed 1000 angstroms, and be up to several microns thick, if it is not necessary to preserve the lustrous appearance of the underlying substrate or to preserve the ductility, workability or weldability of the disordered coating material.

The coating herein contemplated is resistant to atmospheric corrosion. Corrosion resistance is tested utilizing the procedure described by S. Ito, M. Yabumoto, H. Omata, and T. Murak of Nippon Steel Corp., in "Atmospheric Corrosion of Stainless Steels", appearing in *Passivity of Metals and Semiconductors* (M. Frommont, ed.), Elsevier Science Publishers, B.V., Amsterdam, at pages 637 to 642, the disclosure of which is incorporated herein by reference. Utilizing the procedure of Ito, et al the coating herein contemplated does not exhibit a decreased in potential versus a reference electrode for at least about 100 hours when a sodium chloride wetted woven cotton cloth is placed on the coated surface, the cloth being first immersed in 0.5 normal aqueous sodium chloride, and the wetted woven cotton cloth and coated substrate then being placed in a constant temperature, constant humidity chamber at a temperature of 25° C. and a relatively humidity of 55%. This simulates atmospheric corrosion, especially in marine areas, where salt water and/or brine containing chloride ion contacts the material and evaporates, leaving behind concentrated solutions of chloride ion. The potential between the surface and a reference electrode is measured. The onset of corrosion is evidenced when the potential exhibits a sudden drop. A corrosion resistant coating does not exhibit the sudden drop in corrosion resistance until after at least 100 hours of testing. By way of contrast, uncoated type 430 stainless steel shows a 400 millivolt drop in potential by approximately 100 hours of exposure when tested as described above.

The herein contemplated article having an adherent, ductile, disordered silicon carboxynitride coating on a stainless steel substrate is prepared by bringing the stainless steel substrate into a vacuum deposition chamber and maintaining the stainless steel substrate in vacuum. While the stainless steel substrate is maintained in a vacuum, a deposition gas mixture comprising at least a silicon compound and one or more carbon, oxygen, and/or nitrogen compounds is introduced into the vacuum chamber under conditions to form and/or maintain a plasma within the vacuum chamber. The plasma is maintained under conditions to deposit the silicon carboxynitride coating onto the stainless steel substrate.

The invention may be understood by reference to the accompanying figure. As there shown is a microwave glow discharge unit 1 having a vacuum chamber 11. Reactive gases as silanes, oxygen and optionally one or more of ammonia, nitrogen, and phosphine are introduced into the vacuum chamber 11 through gas feed and flange 13 by gas inlet lines 15 and 17. These gases are converted into a plasma and the depleted gases exit the vacuum chamber 11 through a gas outlet end flange 21 and a gas outlet line therein.

In operative communication with the vacuum chamber 11 is provided a microwave source 31 and, within the vacuum chamber 11 is a microwave antenna 33. The antenna 33 is positioned above the grounded substrate holder 53 and substrate 55 whereby to provide a microwave frequency signal to form, excite and/or maintain the plasma.

The plasma deposition process may be a reactive sputtering process or a glow discharge process and is preferably a glow discharge process. The energy to the plasma process may be direct current, or a radio frequency field including microwave range frequencies. Additionally, when the plasma deposition process is reactive sputtering, a magnetron field may cross the electrical field whereby to provide a higher deposition rate.

The plasma deposition process is a vacuum process with a vacuum of $10^{-5}$ torr or less initially provided in the vacuum chamber. The reactive gas has a pressure of about $10^{-3}$ to $10^{-1}$ torr. In reactive sputtering, the vacuum is initially about $10^{-5}$ torr and the vacuum chamber is then charged with inert gas and reactive gases to a pressure of from about $10^{-3}$ torr to about $10^{-2}$ torr. The inert gas, for example, argon, is necessary for the operation of the sputtering process in which the charged argon atoms are impinged by the target material whereby to form ions thereof which are then transported through the plasma to the substrate.

The deposition gas contains silanes, for example, $SiH_4$, $Si_2H_6$, $Si_3H_8$, $Si_4H_{10}$, and/or $Si_5H_{12}$, as well as higher silanes.

The reactive gas further contains oxygen or oxygen compounds, nitrogen or nitrogen compounds, and carbon compounds. Generally, oxygen is introduced into the reactive gas as molecular oxygen. The oxygen provides silicon oxide, $SiO_y$, silicon oxycarbide, $SiC_xO_y$, silicon oxynitride, $SiO_yN_z$, and silicon carboxynitride, $SiC_xO_yN_z$, the stochiometry thereof depending, inter alia, on the composition of the reactive gas. The reactive gas may contain nitrogen, ammonia, or both, whereby to provide nitrogen compounds in the coating, for example, silicon carboxynitrides, $SiC_xO_yN_z$, silicon oxynitrides, $SiO_yN_z$, silicon carbonitrides, $SiC_xN_z$, silicon nitrides $SiN_z$, and mixtures thereof, the stochiometry thereof depending, inter alia, on the composition of the reactive gas.

The reactive gas further contains carbon compounds, e.g., hydrocarbon gases, carbon monoxide, carbon dioxide, or the like. The carbon compound provides silicon carbide, $SiC_x$, silicon oxycarbide, $SiC_xO_y$, silicon carbonitride, $SiC_xN_z$, and silicon carboxynitride, $SiC_xO_yN_z$, the stochiometry thereof depending, inter alia, on the composition of the reactive gas. Alternatively or additionally, the reactive gas may contain phosphine and/or borane whereby to provide up to ten atomic percent phosphorus and/or compounds in the disordered coating. Where necessary to sustain the plasma, the reactive gas may contain a substantially inert gas as argon.

The temperature of the substrate 55 is maintained low enough to provide a quench rate of above about $10^5$° C. per second. Typically, the temperature of the substrate is below about 200° C. and in a particularly preferred exemplification and temperature of the substrate is below about 100° C.

The herein contemplated method of plasma deposition at the contemplated microwave frequency provides a deposition rate of from about 10 to about 250 angstroms per second. In this way, it is possible to rapidly build up a coating of about 1000 angstroms thickness within about 4 to 100 seconds of residence time. Thus, it is possible to coat large area steel sheets in a very short period of time, and to continuously coat large area steel sheets in a plasma deposition system. For example, according to the invention, it is possible to continuously coat steel, for example, from a feed roll of steel sheet through a plasma deposition system to a take-up roll of coated steel sheet with a residence time in the plasma deposition vacuum chamber of less than about 100 seconds.

According to a particularly preferred exemplification of this invention, rolled steel sheet is introduced into the vacuum chamber and drawn out the other end. The chamber may be initially at a vacuum of about $10^{-5}$ torr, pressurized with a reactive gas to a pressure of about $10^{-2}$ torr to about $10^{-1}$ torr, the reactive gas containing silanes and oxygen, carbon compounds, and nitrogen compounds. A microwave source is energized whereby to provide microwave energy at a frequency of about 2.45 gigahertz between a microwave antenna within the vacuum chamber and the stainless steel roll to be coated. The steel is drawn through the vacuum chamber from the inlet end to the outlet end at a linear velocity of about 10 feet per second to about 100 feet per second whereby to form a coating of disordered silicon carboxynitride about 50 to 100 angstroms thick at a residence time of about 2 to about 100 seconds.

While the invention has been described with respect to particular preferred exemplifications thereof, it is not intended to be limited thereby, but solely by the claims appended hereto.

We claim:

1. A coated article comprising:
   (1) a steel substrate; and
   (2) a corrosion resistant coating thereon comprising disordered, non-stoichiometric silicon carboxynitride over at least a portion of the substrate, the silicon carboxynitride being represented by the formula $SiC_xO_yN_z$ where z is from 0.5 to 1.0, y is from 1.0 to 2.0, z is from 0.6 to 1.33, and $(x+0.5y+0.75z)$ is less than or equal to 1.0, and further comprising a non-metal chosen from the group consisting of boron, phosphorus, and mixtures thereof.

2. The coated article of claim 1 wherein the corrosion resistant coating is deposited from a plasma maintained by a microwave field having a frequency of above about 1 gigahertz.

3. The coated article of claim 1, wherein the steel substrate is a stainless steel substrate.

4. The coated article of claim 1, wherein the disordered silicon carboxynitride is substantially amorphous.

5. The coated artical of claim 1, wherein the disordered silicon carboxynitride is substantially microcrystalline.

6. The coated article of claim 1, wherein the disordered silicon carboxynitride is substantially polycrystalline lacking long range compositional order.

7. The coated article of claim 1, wherein the disordered silicon carboxynitride is a mixture of at least two types of phases chosen from the group consisting of amorphous, microcrystalline, and polycrystalline phases.

8. The coated article of claim 1, wherein the coating is resistant to atmospheric corrosion.

9. The coated article of claim 8, wherein the coating is resistant to atmospheric corrosion as determined by the substantial absence of a change in potential for at least about 100 hours, by the method comprising:
   (1) maintaining a 0.5 normal NaCl solution wetted woven cotton cloth in contact with the coating in a closed chamber maintained at 25 degrees centigrade and 55 percent relative humidity; and
   (2) measuring the potential of the surface.

10. The coated article of claim 1, wherein the coating is from about 100 to about 1000 angstroms thick.

11. The coated article of claim 10, wherein the coating is ductile.

12. The coated article of claim 1, wherein the coating is deposited by quenching onto a cold substrate from a plasma.

13. The coated article of claim 12, wherein the substrate temperature during plasma deposition is less than 200 degrees centigrade.

14. The coated article of claim 12, wherein the coating is quenched at a quench rate of at least about $10^5$ degrees centigrade per second.

15. The coated article of claim 12, wherein the plasma is chosen from the group consisting of reactlve sputtering plasmas and glow discharge plasmas.

16. The coated article of claim 15, wherein the plasma is a glow discharge plasma.

17. The coated article of claim 15, wherein the plasma is maintained by an electric field chosen from the group consisting of d.c. fields and radio frequency fields.

18. The coated article of claim 17, wherein the plasma is maintained by a radio frequency field having a frequency of from 1 to 100 gigahertz.

19. A coated article comprising;
   (1) a stainless steel substrate; and
   (2) a corrosion resistant coating thereon comprising microwave plasma deposited, nonstoichiometric disordered silicon carboxynitride over at least a portion of the substrate, the silicon carboxynitride being represented by the formula $SiC_xO_yN_z$ where x is from 0.5 to 1.0, y is from 1.0 to 2.0, z is from 0.6 to 1.33, and $(x+0.5y+0.75z)$ is less than or equal to 1.0, and further comprises a non-metal chosen from the group consisting of boron, phosphorus, and mixtures thereof.

20. A method of forming an adherent, ductile, disordered silicon carboxynitride coating on a stainless steel substrate comprising:
   (a) bringing the stainless steel substrate into a vacuum deposition chamber and maintaining the stainless steel substrate in a vacuum;
   (b) injecting a deposition gas comprising silicon containing gases, nitrogen containing gases, oxygen containing gases, carbon containing gases, and a gas chosen from the group consisting of boron containing gases, phosphorus containing gases, and mixtures thereof, into the vacuum chamber; and (c) forming and maintaining a microwave excited plasma in the vacuum chamber under conditions to deposit a disordered, nonstoichiometric silicon carboxynitride coating having a composition represented by the formula $SiC_xO_yN_z$, where x is from 0.5 to 1.0, y is from 1.0 to 2.0, z is from 0.6 to 1.33, and (x+0.5y+0.75z) is less than or equal to 1.0, and comprising boron, phosphorus, or a mixture thereof, on the stainless steel substrate.

21. The method of claim 20, wherein the substrate temperature during deposition is less than 200 degrees centigrade.

22. The method of claim 20, wherein the silicon compound is chosen from the group consisting of silanes, fluorosilanes, and mixtures thereof.

23. The method of claim 20, wherein the deposition gas contains nitrogen, whereby to provide the nitrogen in the coating.

24. The method of claim 20, wherein the deposition gas contains ammonia, whereby to provide nitrogen in the coating.

25. The method of claim 20, wherein the deposition gas contains oxygen, whereby to provide the oxygen in the coating.

26. The method of claim 20, wherein the deposition gas contains a hydrocarbon, whereby to provide the carbon in the coating.

27. The method of claim 20, wherein the disordered silicon carboxynitride is substantially amorphous.

28. The method of claim 20, wherein the disordered silicon carboxynitride is substantially microcrystalline.

29. The method of claim 20, wherein the disordered silicon carboxynitride is substantially polycrystalline.

30. The method of claim 20, wherein the disordered silicon carboxynitride is a mixture of at least two types of phases chosen from the group consisting of amorphous, microcrystalline, and polycrystalline phase.

31. The method of claim 20, wherein the silicon carboxynitride is a non-stochiometric composition.

32. The method of claim 20, comprising depositing the coating to a thickness less than 1000 angstroms.

33. The method of claim 32 wherein the coating is ductile.

34. The method of claim 20 wherein the coating is corrosion resistant.

35. The method of claim 34, wherein the coating is resistant to atmospheric corrosion.

36. The method of claim 35 wherein the coating is resistant to atmospheric corrosion as determined by the substantial absence of a change in potential for at least about 100 hours by the method comprising:
  (1) maintaining a 0.5 normal NaCL solution wetted woven cotton cloth in contact with the disordered silicon carboxynitride coating in closed chamber maintained at 25 degrees centigrade and 55 percent realtive humidity; and
  (2) measuring the potential of the surface.

37. A stainless steel article having a corrosion resistant, adherent, ductile, disordered, nonstoichiometric silicon carboxynitride coating thereon, prepared by the method comprising:

(a) bringing the stainless steel substrate into a vacuum deposition chamber and maintaining the stainless steel substrate in a vacuum;
(b) injecting a deposition gas comprising a silicon containing gas, a carbon containing gas, and a nitrogen containing gas, an oxygen containing gas, and one or more of a boron compound, a phosphorus compound, or a mixture thereof into the vacuum chamber; and
(c) forming and maintaining a plasma by microwave excitation in the vacuum chamber under conditions to deposit the disordered silicon carboxynitride coating on the stainless steel substrate.

38. The steel article of claim 37, wherein the substrate temperature during deposition is less than 200 degrees centigrade.

39. The steel article of claim 37, wherein the coating is quenched at a quench rate of at least about $10^5$ degrees centigrade per second.

40. The article of claim 37, wherein the silicon compound is chosen from the group consisting of silanes, fluorosilanes, and mixtures thereof.

41. The steel article of claim 37, wherein the deposition gas contains nitrogen, whereby to provide the nitrogen in the coating.

42. The steel article of claim 37, wherein the deposition gas contains ammonia, whereby to provide the nitrogen in the coating.

43. The steel article of claim 37, wherein the deposition gas contains oxygen, whereby to provide the oxygen in the coating.

44. The steel article of claim 37, wherein the deposition gas contains a hydrocarbon, whereby to provide the carbon in the coating.

45. The steel article of claim 37, wherein the disordered silicon carboxynitride is substantially amorphous.

46. The steel article of claim 37, wherein the disordered silicon carboxynitride is substantially microcrystalline.

47. The steel article of claim 37, wherein the disordered silicon carboxynitride is substantially polycrystalline.

48. The steel article of claim 37, wherein the disordered silicon carboxynitride is a mixture of at least two types of phases chosen from the group consisting of amorphous, microcrystalline, and polycrystalline phase.

49. The steel article of claim 37, comprising depositing the coating to a thickness less than 1000 angstrom.

50. The steel article of claim 37, wherein the coating is resistant to atmospheric corrosion.

51. The steel article of claim 50 wherein the coating is resistant to atmospheric corrosion as determined by the substantial absence of a change in potential for at least about 100 hours by the method comprising:
  (1) maintaining a 0.5 normal NaCl solution wetted woven cotton cloth in contact with the disordered silicon carboxynitride coating in closed chamber maintained at 25 degrees centigrade and 55 percent relative humidity; and
  (2) measuring the potential of the surface.

* * * * *

UNITED STATES PATENT AND TRADEMARK OFFICE
CERTIFICATE OF CORRECTION

PATENT NO. : 4,568,614

DATED : February 4, 1986

INVENTOR(S) : Erwin Eichen, West Bloomfield; John Keem, Bloomfield Hills, both of Michigan It is certified that error appears in the above-identified patent and that said Letters Patent is hereby corrected as shown below:

Column 1, line 36, change " 'E$^-$" to --1e$^-$--;
Column 1, line 41, change "B+1e$^-$" to --1e$^-$--;
Column 3, line 18, insert --and-- after "2.0,";
Column 3, line 38, change "sputtering" to --Sputtering--;
Column 4, line 57, delete "SiC$_x$O$_y$N$_2$" insert --SiC$_x$O$_y$N$_z$--;
Column 7, line 52, delete "where$^y$z" insert --where x--;
Column 8, line 34, delete "reactlve" insert --reactive--;
Column 9, line 52, delete "NaCL" insert --NaCl--.

Signed and Sealed this

Fifth Day of August 1986

[SEAL]

Attest:

DONALD J. QUIGG

Attesting Officer

Commissioner of Patents and Trademarks